(12) United States Patent
Oyamatsu

(10) Patent No.: US 6,261,920 B1
(45) Date of Patent: Jul. 17, 2001

(54) N-CHANNEL MOSFET HAVING STI STRUCTURE AND METHOD FOR MANUFACTURING THE SAME

(75) Inventor: Hisato Oyamatsu, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/389,359

(22) Filed: Sep. 3, 1999

(30) Foreign Application Priority Data

Sep. 4, 1998 (JP) .................................................. 10-251116

(51) Int. Cl.$^7$ .................................................. H01L 21/76
(52) U.S. Cl. .......................... 438/424; 257/510; 257/513; 257/514; 257/515; 438/424; 438/433; 438/435; 438/436
(58) Field of Search .................................... 257/510, 513, 257/514, 515; 438/407, 423, 424, 433, 435, 436, 437

(56) References Cited

U.S. PATENT DOCUMENTS 5,811,347 * 9/1998 Gardner et al. ...................... 438/435

6,057,241 * 5/2000 Matsuda et al. ...................... 438/689

* cited by examiner

*Primary Examiner*—Olik Chaudhuri
*Assistant Examiner*—Wai-Sing Louie
(74) *Attorney, Agent, or Firm*—Banner & Witcoff, Ltd.

(57) ABSTRACT

A semiconductor device includes an n-channel MOSFET isolated by an element isolation region of STI structure. A silicon nitride (SiN) region is formed in an Si substrate near the interface between the element isolation region and the Si substrate. The silicon nitride region is formed by ion-implanting nitrogen (N) into the Si substrate. The silicon nitride region is acts as a barrier layer for preventing substrate impurity of the n-channel MOSFET (impurity contained in the channel region) from being thermally diffused into the element isolation region. The silicon nitride region is distributed from the main surface of the Si substrate in the end portion of the element isolation region to a region deeper than the substrate depth which determines the threshold voltage of the MOSFET.

6 Claims, 9 Drawing Sheets

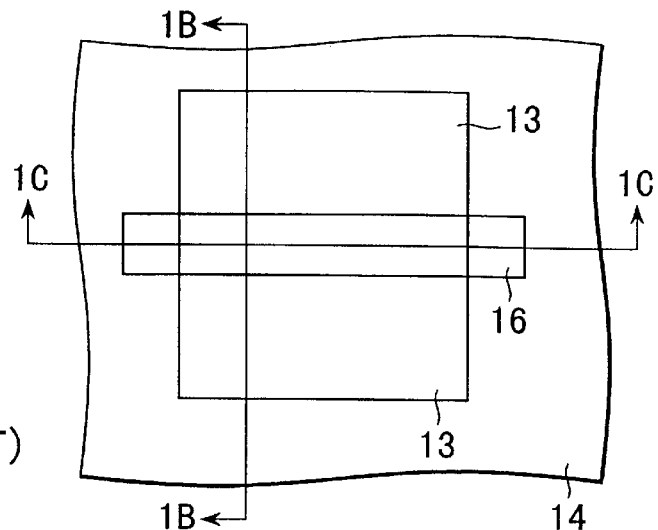
FIG. 1A (PRIOR ART)
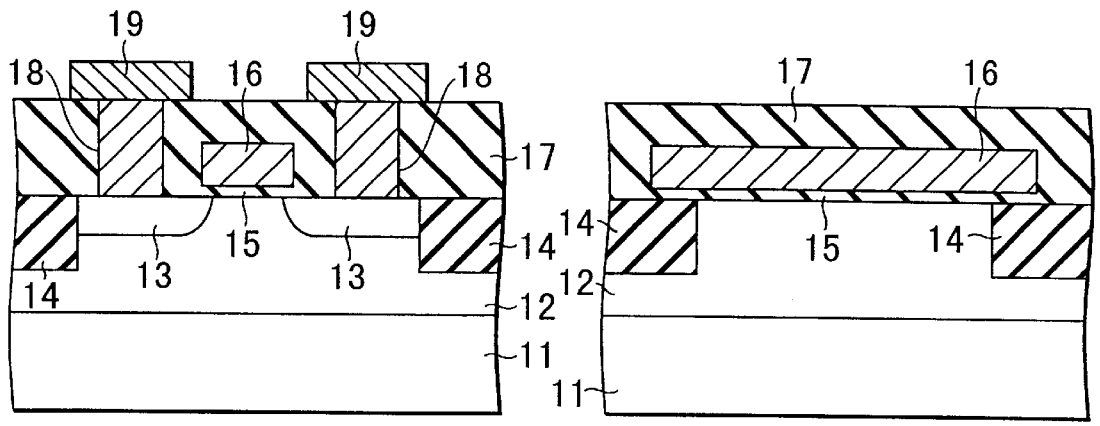
FIG. 1B (PRIOR ART)
FIG. 1C (PRIOR ART)
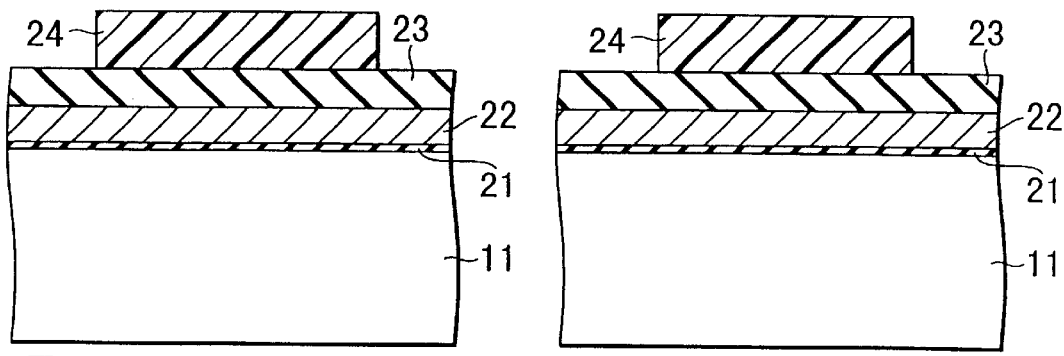
FIG. 2A (PRIOR ART)
FIG. 2B (PRIOR ART)

N-CHANNEL MOSFET HAVING STI STRUCTURE AND METHOD FOR MANUFACTURING THE SAME

BACKGROUND OF THE INVENTION

This invention relates to an n-channel MOSFET having an STI (Shallow Trench Isolation) structure and a method for manufacturing the same, and more particularly to the improvement of the kink characteristic of an n-channel MOSFET.

Recently, in order to attain the high integration density and high performance of an LSI by miniaturizing elements, an element isolation insulating film of STI structure has been often used instead of an element isolation insulating film formed by the LOCOS (Local Oxidation Of Silicon) method which has been conventionally widely used.

(a) In the LOCOS method, since an $SiO_2$ film is formed on the element isolation region by thermal oxidation while a film such as an $Si_3N_4$ film having good resistance to oxidation is used as a mask, it becomes difficult to enhance the insulation property thereof in the depth direction by making the element isolation film thick and it is impossible to attain a sufficiently long effective element isolation distance owing to miniaturization, and (b) since oxidation proceeds in the end portion of the element isolation region in the thermal oxidation process, a field bird's beak is formed to act as a troublesome obstacle to the miniaturization. On the other hand, in the STI structure, (c) since the pattern dimension is determined by the normal photo-etching process and anisotropic dry etching process, a fine pattern dimension can be attained by use of the high processing technology, and (d) since a long effective element isolation distance can be easily attained in the depth direction by forming a deep trench, for example, it is more advantageous for miniaturization in comparison with the element isolation insulating film formed by the LOCOS method. By the above reasons, in the recent LSI, the element isolation region is formed with the STI structure which is advantageous for miniaturization.

As one example of a conventional semiconductor device having the above STI structure, an n-channel MOSFET and a manufacturing method therefor are explained. FIG. 1A is a pattern view, FIG. 1B is a cross sectional view taken along the 1B—1B line of FIG. 1A and FIG. 1C is a cross sectional view taken along the 1C—1C line of FIG. 1A. A p-well region 12 is formed in the main surface portion of a p-type Si substrate 11. In the p-well region 12, $n^+$-type diffusion layers used as source/drain regions 13 of the n-channel MOSFET are separately formed. A trench is formed in the main surface portion of the p-type Si substrate 11 and an oxide film (buried oxide film) 14 is filled in the trench to form an element isolation region of STI structure. A gate insulating film 15 is formed on a portion of the substrate 11 which lies between the source and drain regions 13 and a gate electrode 16 is formed on the gate insulating film. An inter-level insulating film ($SiO_2$/BPSG) 17 is formed on the main surface of the substrate 11. Contact plugs 18 are formed in contact holes formed in portions of the inter-level insulating film 17 which correspond to the source/drain regions 13. Metal wirings used as source/drain electrodes 19 are formed on the inter-level insulating film 17. The source/drain electrodes 19 are electrically connected to the source/drain regions 13 via the contact plugs 18, respectively.

Next, a manufacturing method of the n-channel MOSFET shown in FIGS. 1A, 1B and 1C is explained. FIGS. 2A to 8A are cross sectional views showing the cross sections taken along the 1B—1B line of FIG. 1A in the order of the manufacturing steps. FIGS. 2B to 8B are cross sectional views showing the cross sections taken along the 1C—1C line of FIG. 1A in the order of the manufacturing steps. First, as shown in FIGS. 2A and 2B, the main surface of the p-type Si substrate 11 is subjected to the thermal oxidation process to form an $SiO_2$ film (buffer film) 21 with a thickness of 10 nm, for example. Then, a polycrystalline Si film 22 with a thickness of approx. 200 nm is deposited and formed on the above film by the LP-CVD method. Further, an $SiO_2$ film 23 with a thickness of 200 nm is deposited and formed on the above film 22 by the LP-CVD method. Next, a mask (resist pattern) 24 corresponding to the element region is formed on the $SiO_2$ film 23 by the photo-etching process. The $SiO_2$ film 23 is etched by the anisotropic dry etching process having a large selective etching ratio with respect to polycrystalline Si with the resist pattern 24 used as a mask.

After this, the resist pattern 24 is separated. Then, the polycrystalline Si film 22 is etched by the anisotropic dry etching process having a sufficiently large selective etching ratio with respect to an oxide film with the remaining $SiO_2$ film 23 used as a mask, further the thermal oxide film ($SiO_2$ film) 21 is etched, and as a result, the structure shown in FIGS. 3A and 3B is obtained.

After this, the Si substrate 11 is etched to the depth of approx. 0.5 $\mu$m by the anisotropic dry etching process having a sufficiently large selective etching ratio with respect to an oxide film so as to form a trench 25 used for forming the STI structure as shown in FIGS. 4A and 4B.

Then, an $SiO_2$ film 14 is deposited and formed to the thickness of approx. 1.5 $\mu$m on the entire surface of the resultant semiconductor structure by the LP-CVD method. Next, the $SiO_2$ film 14 is made flat by the CMP (Chemical Mechanical Polishing) method having a preset selective etching ratio with respect to polycrystalline Si. After the planarization process, the $SiO_2$ films 14, 23 are etched by use of $NH_4F$ or by the dry etching process until the main surface of the polycrystalline Si film 22 is just exposed. As a result, the $SiO_2$ film is left behind in the trench 25 and the buried oxide film 14 is formed (refer to FIGS. 5A and 5B).

Next, the polycrystalline Si film 22 is etched and removed by the isotropic dry etching process having a sufficiently large selective etching ratio with respect to $SiO_2$ and then the heat treatment for reducing the film stress of the buried oxide film 14 is effected at a temperature of 1000° C., for example. After this, the $SiO_2$ film 21 on the Si substrate 11 is removed by the etching process using $NH_4F$ and a new $SiO_2$ film (sacrificial oxide film) 26 is formed on the Si substrate 11 by the thermal oxidation process at a temperature of 800° C., for example. Then, boron (B) is implanted with, for example, the acceleration energy 200 keV and the dose amount of approx. $8 \times 10^{12}$ $cm^{-2}$ in order to form a p-well region 12 and boron (B) is further implanted in a condition that, for example, the acceleration energy is 50 keV and the dose amount is approx. $1 \times 10^{13}$ $cm^{-2}$ in order to control the threshold voltage of the n-channel MOSFET. Next, the heat treatment is effected at 1000° C. for 30 seconds to activate the doped impurity (FIGS. 6A and 6B).

Further, the sacrificial oxide film 26 on the surface of the Si substrate 11 is removed and the surface of the Si substrate 11 is thermally oxidized at a temperature of 750° C. to form a gate oxide film 15 with a thickness of 6 nm. Then, polycrystalline Si is deposited to 300 nm on the entire surface of the gate oxide film 15 by the LP-CVD method. A mask (resist pattern) 27 used for forming a gate electrode is formed by the photo-etching process and the polycrystalline Si film is patterned by the anisotropic dry etching process having a sufficiently large selective etching ratio with respect to $SiO_2$ with the resist pattern 27 used as a mask to form a gate electrode 16 (FIGS. 7A and 7B).

After this, arsenic (As) is ion-implanted into the Si substrate 11 in a condition that, for example, the acceleration energy is 50 keV and the dose amount is approx. $5 \times 10^{15}$ $cm^{-2}$ and the heat treatment is effected for approx. 30 seconds in an $N_2$ atmosphere of 1000° C. to form $n^+$-type diffusion layers used as the source/drain regions 13. At this time, since the ion-implantation process is effected with the gate electrode 16 used as a mask, the gate electrode 16 is also doped with impurity and becomes an $n^+$ type (FIGS. 8A and 8B).

After this, the steps for forming an inter-level insulating film 17, forming contact holes, forming contact plugs 18 and forming source/drain electrodes 19 by preset metallization and the like are effected to form the n-channel MOSFET as shown in FIGS. 1A, 1B and 1C.

In the n-channel MOSFET having the element isolation region with STI structure formed therein, a kink characteristic appearing in the sub-threshold characteristic of the MOSFET as shown in FIG. 9 is a serious problem. As shown in FIG. 9, the kink characteristic exhibits a double characteristic curve in the sub-threshold region which is not observed in a normal MOSFET. As shown in FIG. 10A, it is considered that the sub-threshold characteristic occurs in an end portion 28 of the STI structure in the n-channel MOSFET and the reason is as follows.

(1) In the STI end portion, unlike the element isolation insulating film (refer to portions 29 indicated by broken lines) formed by the LOCOS method as shown in FIG. 10B, a sharp Si end is formed in contact with the channel region and the effective threshold voltage of part of the region is lowered by concentration of the electric field in the corner portion so as to cause the kink characteristic.

(2) The impurity in the Si substrate is out diffused into the insulating film region of STI structure by forming the STI structure and the effective threshold voltage of the channel region of the STI end portion is lowered. Particularly, in the STI structure, since area of the cross section which is formed in contact with the insulating film in the channel end portion becomes large with respect to the element isolation insulating film formed by the LOCOS method, it is easily influenced by the out diffusion. Therefore, the threshold voltage of the MOSFET in the STI end portion is locally lowered to cause the kink characteristic.

It is considered that the kink phenomenon of the MOSFET occurs by a combination of the above two reasons, but the kink phenomenon appears significantly in the n-channel MOSFET and is not observed in the p-channel MOSFET when the MOSFETs are formed by the CMOS process. This is because phosphorus (P) or arsenic (As) which piles up and is not out diffused with respect to the $SiO_2$ film in the STI region is used as the impurity of the substrate region in the p-channel MOSFET. On the other hand, in the n-channel MOSFET, the problem occurs since boron (B) which tends to be out diffused into the STI region is used as the impurity of the substrate and boron is out diffused to lower the impurity concentration.

Thus, since the channel width is determined only by the STI end portion, the degree of the kink characteristic which is associated with the driving power of the MOSFET of this portion is as small as negligible. However, as is clearly understood from FIG. 9, since a large leak current which does not normally appear occurs, it becomes a great obstacle to miniaturization of elements and enhancement of the operation speed. If the high-speed operation of the LSI is taken into consideration, the lower limit of the leak current in the standby state is determined by the kink characteristic and the lower limit of the threshold voltage of the MOSFET in the LSI is determined by the threshold voltage given by a parasitic MOSFET, and therefore, the influence thereof is extremely large. If the threshold voltage of the parasitic MOSFET is lower by 0.2V than that of the normal MOSFET, the threshold voltage which is set at 0.5V in the case of the operation voltage of 2.5V must be set to 0.7V and it is predicted that the performance is lowered by approx. 10% when considering a current model of Shockley. Therefore, if a lowering in the power supply voltage with miniaturization is considered, the influence thereof becomes extremely large and it is necessary to improve the kink characteristic in both of the high integration density and high performance.

As described above, in the conventional MISFET having the STI structure, the kink characteristic is a serious problem. The kink characteristic is caused by the influence of concentration of the electric field or the like in the STI end portion, but if the threshold voltage of part of the STI end portion is effectively lowered, a parasitic MISFET having a lower threshold voltage is apparently formed and the leak current of the MISFET increases.

BRIEF SUMMARY OF THE INVENTION

Accordingly, an object of this invention is to provide a semiconductor device in which a leak current caused by the kink characteristic can be reduced and the high integration density and high performance can be attained.

Another object of this invention is to provide a method for manufacturing a semiconductor device in which a leak current caused by the kink characteristic can be reduced and the high integration density and high performance can be attained.

The above object can be attained by a semiconductor device comprising a semiconductor substrate; an element isolation region of STI (Shallow Trench Isolation) structure formed in the main surface portion of the semiconductor substrate; a MISFET formed in an element region isolated by the element isolation region; and a barrier region formed in a portion of the semiconductor substrate which is adjacent to the element isolation region, for preventing impurity in the channel region of the MISFET from being diffused into the element isolation region.

With the above construction, since the substrate impurity barrier layer is formed on the end portion of the element isolation region of STI structure, impurity in the channel region can be suppressed from being thermally diffused into the element isolation region to lower the impurity concentration of the substrate. Therefore, a lowering in the threshold voltage of the parasitic MISFET formed in the STI end portion can be suppressed and the kink characteristic can be reduced. Further, if impurity piles up in the STI end portion, the effective threshold voltage determined by the impurity concentration increases to cancel a lowering in the threshold voltage by concentration of the electric field in the STI end portion so that a good MISFET characteristic free from the kink characteristic can be attained. By the improvement of the kink characteristic, since a leak current in the OFF state of the MISFET can be reduced, it becomes possible to attain the MISFET characteristic of high performance in which the standby power of the LSI chip can be kept constant and the threshold voltage is further lowered. As a result, the operation speed of the LSI using the above MISFET can be enhanced.

Further, the other object of this invention can be attained by a method for manufacturing a semiconductor device comprising the steps of forming a trench for STI (Shallow Trench Isolation) in the main surface portion of a semiconductor substrate; ion-implanting nitrogen (N) into the semiconductor substrate exposed to the trench to form a barrier region containing silicon nitride (SiN) on the side wall portion of the trench; filling an insulating material into the trench to form an element isolation region of STI structure; and forming a MISFET in an element region isolated by the element isolation region.

With the above manufacturing method, a silicon nitride region having the barrier property to out diffusion of substrate impurity such as boron (B) can be formed in a portion of the semiconductor substrate which lies near the element isolation region of STI structure adjacent to the channel region of the MISFET. Therefore, substrate impurity can be suppressed from being thermally diffused into the element isolation region to lower the impurity concentration of the substrate and thus the kink characteristic can be improved. By the improvement of the kink characteristic, since a leak current in the OFF state of the MISFET can be reduced, it becomes possible to attain the MISFET of high performance in which the standby power of the LSI chip can be kept constant and the threshold voltage is further lowered.

Further, the other object of this invention can be attained by a method for manufacturing a semiconductor device comprising the steps of forming a buffer film on a semiconductor substrate; forming a mask used for forming a trench for STI (Shallow Trench Isolation) in the main surface portion of the semiconductor substrate on the buffer film; ion-implanting nitrogen (N) into the semiconductor substrate by use of the mask to form a silicon nitride (SiN) region; etching the main surface of the semiconductor substrate by use of the mask to form a trench on the side wall portion of which a barrier region formed of part of the silicon nitride region left behind is formed; filling an insulating material into the trench to form an element isolation region of STI structure; and forming a MISFET in an element region isolated by the element isolation region.

With the above manufacturing method, the silicon nitride region can be formed before forming the element isolation region of STI structure. The presence of the silicon nitride region can suppress substrate impurity such as boron (B) from being thermally diffused into the element isolation region to lower the impurity concentration of the substrate and thus the kink characteristic can be improved. By the improvement of the kink characteristic, since a leak current in the OFF state of the MISFET can be reduced, it becomes possible to attain the MISFET of high performance in which the standby power of the LSI chip can be kept constant and the threshold voltage is further lowered. Further, since nitrogen is ion-implanted via the mask for forming the STI trench, the number of mask forming steps is not increased.

Further, the other object of this invention can be attained by a method for manufacturing a semiconductor device comprising the steps of forming a trench for STI (Shallow Trench Isolation) in the main surface portion of a semiconductor substrate; filling an insulating material into the trench to form an element isolation region of STI structure; forming a mask on part of an element region except a boundary region thereof with the element isolation region; ion-implanting nitrogen (N) into the boundary region of the semiconductor substrate with the element isolation region by use of the mask to form a barrier region containing silicon nitride (SiN); and forming a MISFET in the element region isolated by the element isolation region.

With the above manufacturing method, the silicon nitride region is formed by ion-implanting nitrogen into the semiconductor substrate after the buried oxide film in the STI region is made flat and before impurity ion for forming a well region or the like is implanted. Since the silicon nitride region is formed in part of the semiconductor substrate which is adjacent to the element isolation region of STI structure, substrate impurity such as boron (B) can be suppressed from being thermally diffused into the element isolation region to lower the impurity concentration of the substrate and thus the kink characteristic can be improved. By the improvement of the kink characteristic, since a leak current in the OFF state of the MISFET can be reduced, it becomes possible to attain the MISFET of high performance in which the standby power of the LSI chip can be kept constant and the threshold voltage is further lowered.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1A is a pattern plan view of an n-channel MOSFET, for illustrating the conventional semiconductor device;

FIG. 1B is a cross sectional view taken along the 1B—1B line of the pattern shown in FIG. 1A;

FIG. 1C is a cross sectional view taken along the 1C—1C line of the pattern shown in FIG. 1A;

FIG. 2A is a cross sectional view taken along the 1B—1B line of the pattern shown in FIG. 1A and showing the first manufacturing step, for illustrating the manufacturing method of the conventional semiconductor device;

FIG. 2B is a cross sectional view taken along the 1C—1C line of the pattern shown in FIG. 1A and showing the first manufacturing step, for illustrating the manufacturing method of the conventional semiconductor device;

DETAILED DESCRIPTION OF THE INVENTION

In order to suppress the kink characteristic of an n-channel MOSFET, the technique for suppressing the out diffusion of substrate impurity (impurity contained in the channel region) in the STI end portion of the MOSFET is required. Therefore, in this invention, much attention is paid to boron (B) used as substrate impurity of the n-channel MOSFET and a silicon nitride region having a barrier property to out diffusion of boron (B) is formed in part of the substrate which lies near the STI region adjacent to the channel region of the MOSFET. There will now be described embodiments of this invention in detail with reference to the accompanying drawings.

[First Embodiment]

Figure 3A:
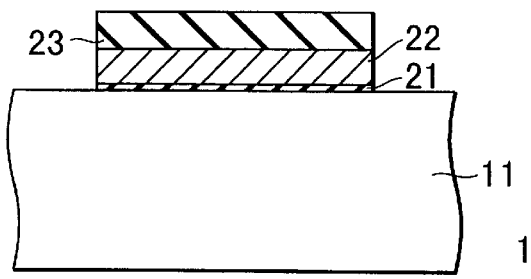
FIG. 3A is a cross sectional view taken along the 1B—1B line of the pattern shown in FIG. 1A and showing the second manufacturing step, for illustrating the manufacturing method of the conventional semiconductor device.
Figure 3B:
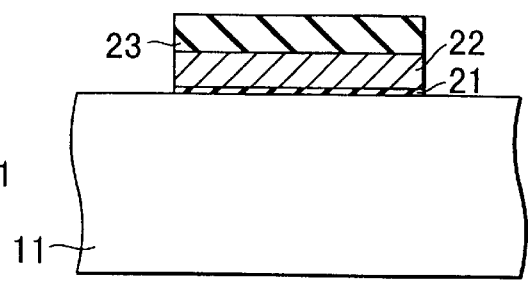
FIG. 3B is a cross sectional view taken along the 1C—1C line of the pattern shown in FIG. 1A and showing the second manufacturing step, for illustrating the manufacturing method of the conventional semiconductor device.
Figure 4A:
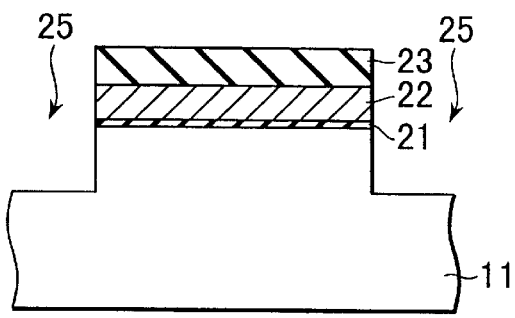
FIG. 4A is a cross sectional view taken along the 1B—1B line of the pattern shown in FIG. 1A and showing the third manufacturing step, for illustrating the manufacturing method of the conventional semiconductor device.
Figure 4B:
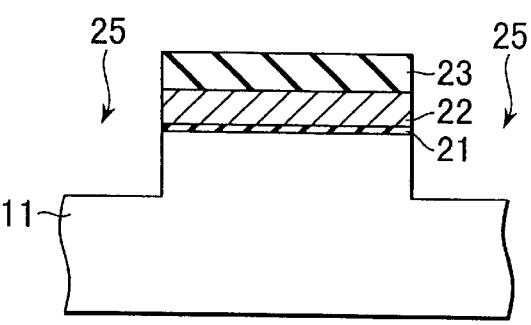
FIG. 4B is a cross sectional view taken along the 1C—1C line of the pattern shown in FIG. 1A and showing the third manufacturing step, for illustrating the manufacturing method of the conventional semiconductor device.
Figure 5A:
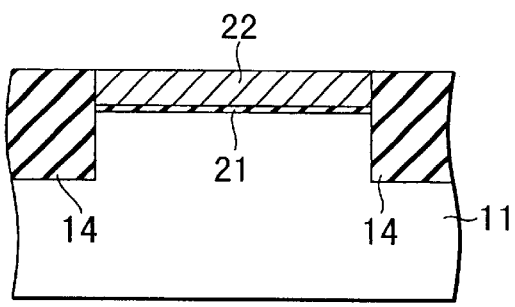
FIG. 5A is a cross sectional view taken along the 1B—1B line of the pattern shown in FIG. 1A and showing the fourth manufacturing step, for illustrating the manufacturing method of the conventional semiconductor device.
Figure 5B:
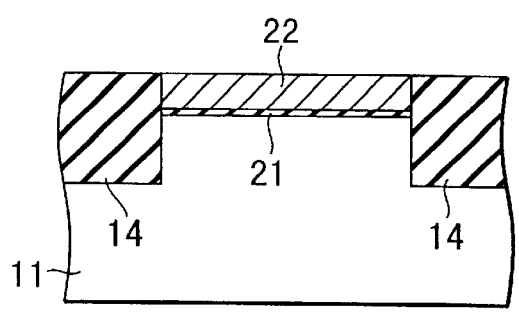
FIG. 5B is a cross sectional view taken along the 1C—1C line of the pattern shown in FIG. 1A and showing the fourth manufacturing step, for illustrating the manufacturing method of the conventional semiconductor device.
Figure 6A:
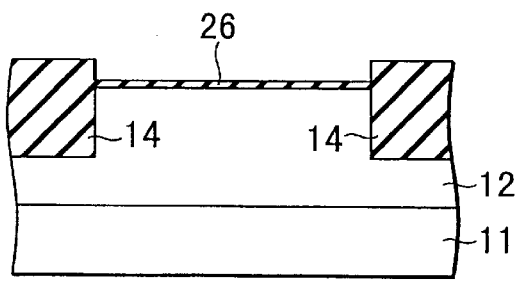
FIG. 6A is a cross sectional view taken along the 1B—1B line of the pattern shown in FIG. 1A and showing the fifth manufacturing step, for illustrating the manufacturing method of the conventional semiconductor device.
Figure 6B:
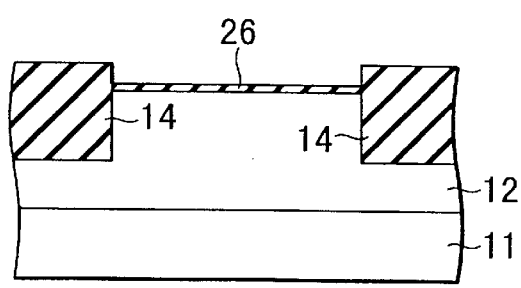
FIG. 6B is a cross sectional view taken along the 1C—1C line of the pattern shown in FIG. 1A and showing the fifth manufacturing step, for illustrating the manufacturing method of the conventional semiconductor device.
Figure 7A:
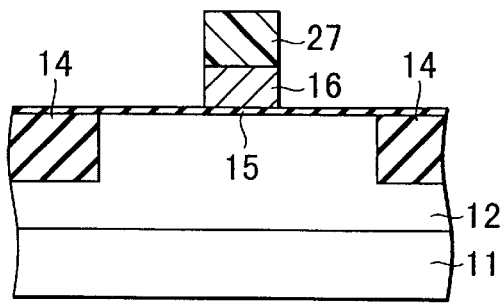
FIG. 7A is a cross sectional view taken along the 1B—1B line of the pattern shown in FIG. 1A and showing the sixth manufacturing step, for illustrating the manufacturing method of the conventional semiconductor device.
Figure 7B:
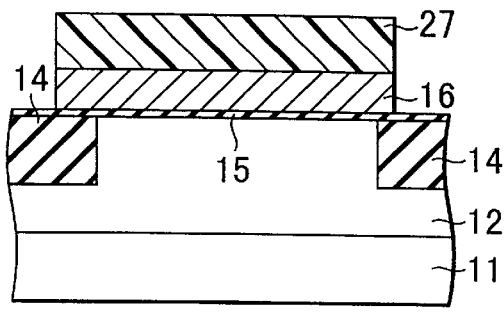
FIG. 7B is a cross sectional view taken along the 1C—1C line of the pattern shown in FIG. 1A and showing the sixth manufacturing step, for illustrating the manufacturing method of the conventional semiconductor device.
Figure 8A:
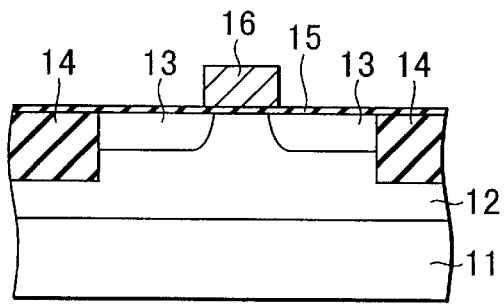
FIG. 8A is a cross sectional view taken along the 1B—1B line of the pattern shown in FIG. 1A and showing the seventh manufacturing step, for illustrating the manufacturing method of the conventional semiconductor device.
Figure 8B:
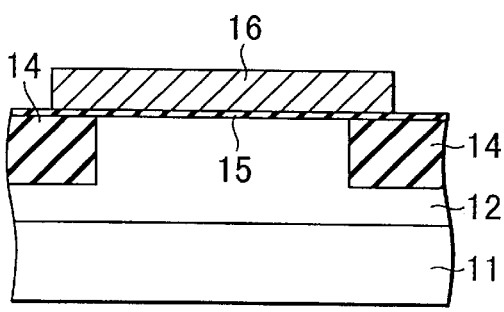
FIG. 8B is a cross sectional view taken along the 1C—1C line of the pattern shown in FIG. 1A and showing the seventh manufacturing step, for illustrating the manufacturing method of the conventional semiconductor device.
Figure 9:
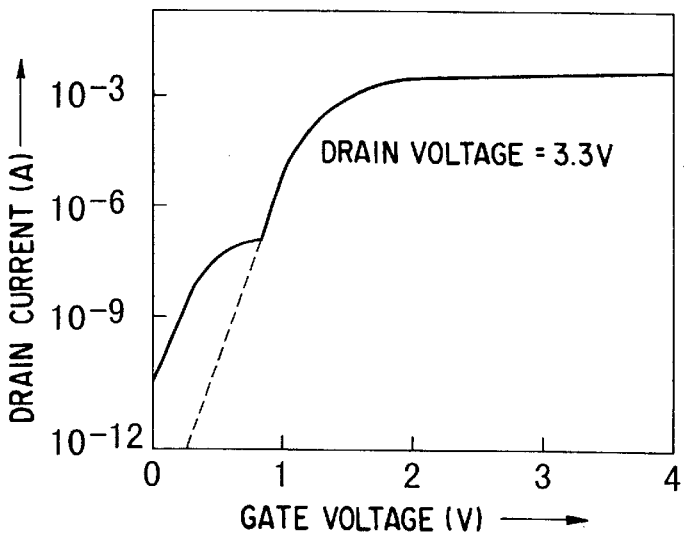
FIG. 9 is a diagram for illustrating the kink characteristic appearing in the sub-threshold characteristic of an n-channel MOSFET.
Figure 10A:
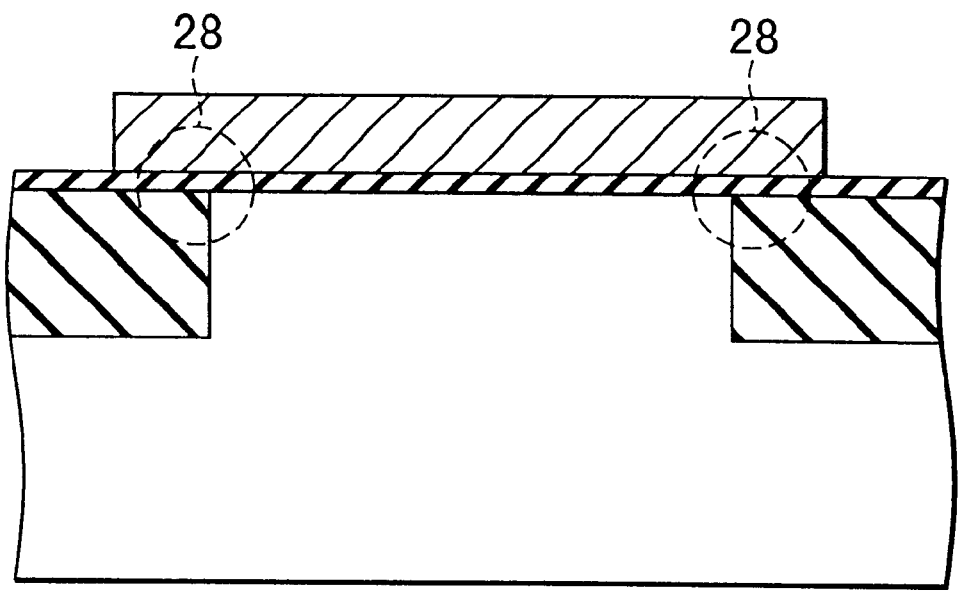
FIG. 10A is a cross sectional view showing a case of STI structure, for illustrating the sub-threshold characteristic.
Figure 10B:
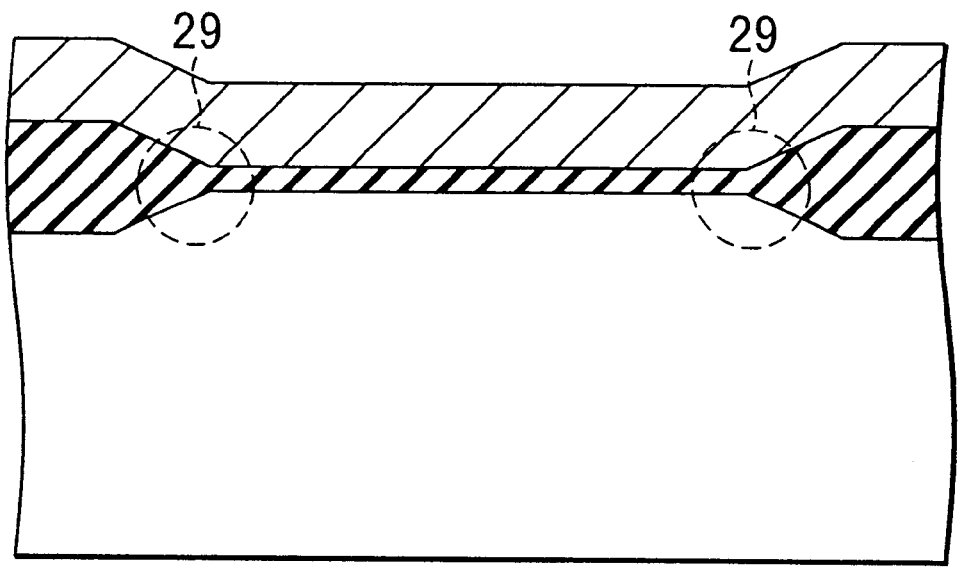
FIG. 10B is a cross sectional view showing a case of an element isolation insulating film formed by the LOCOS method, for illustrating the sub-threshold characteristic.
Figure 11A:
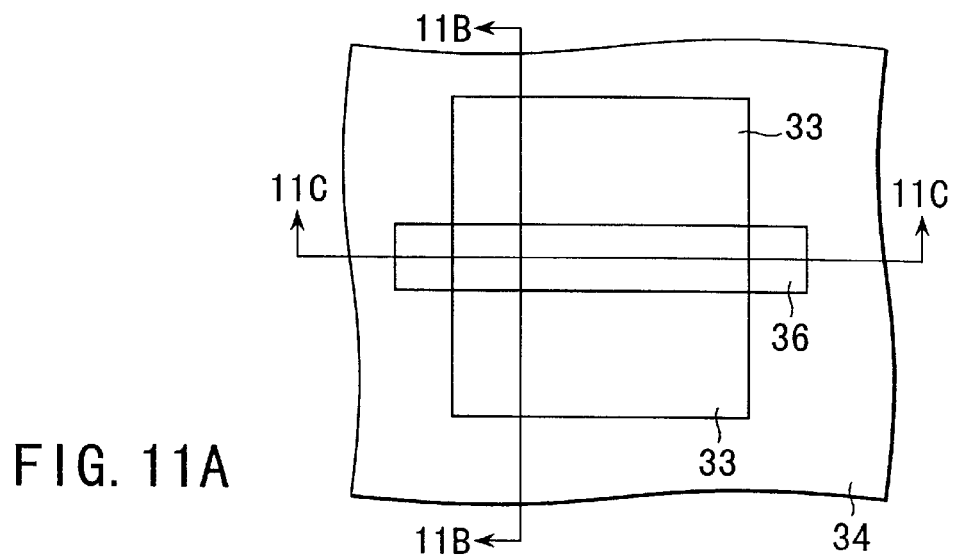
FIG. 11A is a pattern plan view of an n-channel MOSFET, for illustrating a semiconductor device according to a first embodiment of this invention.
Figure 11B:
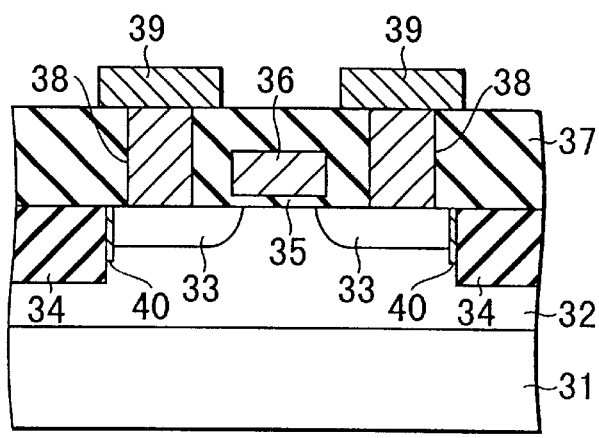
FIG. 11B is a cross sectional view taken along the 11B—11B line of the pattern shown in FIG. 11A, for illustrating the semiconductor device according to the first embodiment of this invention.
Figure 11C:
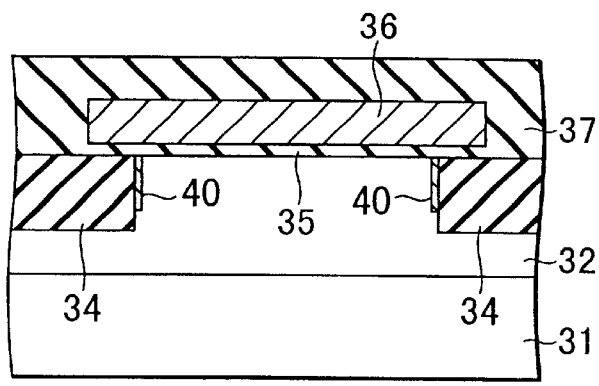
FIG. 11C is a cross sectional view taken along the 11C—11C line of the pattern shown in FIG. 11A, for illustrating the semiconductor device according to the first embodiment of this invention.

FIGS. 11A, 11B and 11C illustrate a semiconductor device according to a first embodiment of this invention, and FIG. 11A is a pattern plan view of an n-channel MOSFET, FIG. 11B is a cross sectional view taken along the 11B—11B line of the pattern shown in FIG. 11A, and FIG. 11C is a cross sectional view taken along the 11C—11C line of the pattern shown in FIG. 11A. A p-well region 32 is formed in the main surface portion of a p-type Si substrate 31. In the p-well region 32, $n^+$-type diffusion layers used as source/drain regions 33 of the n-channel MOSFET are separately formed. A trench is formed in the main surface portion of the p-type Si substrate 31 and an oxide film (buried oxide film) 34 is filled in the trench to form an element isolation region of STI structure. A silicon nitride region 40 acting as a barrier material to out diffusion of boron (B) is formed in the Si substrate 31 (p-well region 32) of the boundary region between the Si substrate 31 (p-well region 32) and the buried oxide film 34 used as the element isolation region. The silicon nitride region 40 is not formed in the effective channel region of the MOSFET and is formed in a portion corresponding to the channel region of a parasitic MOSFET and formed from the main surface of the Si substrate 31 to a region deeper than the substrate depth which determines the threshold voltage of the MOSFET in the STI end portion. Further, a gate insulating film 35 is formed on a portion of the Si substrate 31 which lies between the source and drain regions 33 and a gate electrode 36 is formed on the gate insulating film. An inter-level insulating film ($SiO_2$/BPSG) 37 is formed on the main surface of the substrate 31. Contact plugs 38 are formed in contact holes formed in portions of the inter-level insulating film 37 which correspond to the source/drain regions 33. Metal wirings used as source/drain electrodes 39 are formed on the inter-level insulating film 37 and the source/drain electrodes 39 are electrically connected to the source/drain regions 33 via the contact plugs 38.

With the above construction, since the silicon nitride region 40 acting as the substrate impurity (boron) barrier material is formed on the STI end, boron in the Si substrate 31 can be suppressed from being out diffused (thermally diffused) into the STI region and a lowering in the threshold voltage of the parasitic MOSFET formed in the STI end portion can be suppressed and thus the kink characteristic can be reduced. By the improvement of the kink characteristic, since a leak current in the OFF state of the MOSFET can be reduced, it becomes possible to attain the high performance MOSFET characteristic in which the standby power of the LSI chip can be kept constant and the threshold voltage is further lowered. As a result, the operation speed of the LSI can be enhanced. Further, since the silicon nitride region 40 is formed in the Si substrate 31 (p-well region 32) on the STI end, the high integration density will not be lowered. In addition, since the silicon nitride region 40 is formed from the main surface of the Si substrate 31 to a region deeper than the substrate depth which determines the threshold voltage of the MOSFET in the STI end portion, the effect of piling up impurity can be derived as in the case of the p-channel MOSFET and thus an n-channel MOSFET in which the reason (2) described before can be eliminated and the kink characteristic caused by the reason (1) can be suppressed can be provided.

Figure 12A:
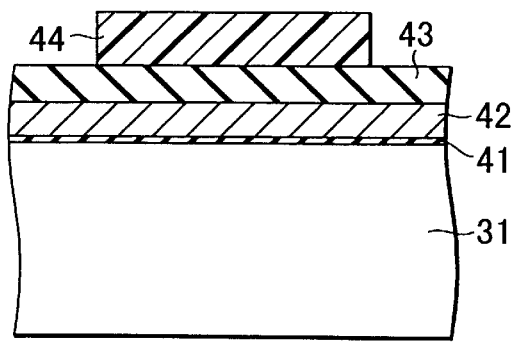
FIG. 12A is a cross sectional view taken along the 11B—11B line of the pattern shown in FIG. 11A and showing the first manufacturing step, for illustrating the manufacturing method of the semiconductor device according to the first embodiment of this invention.
Figure 12B:
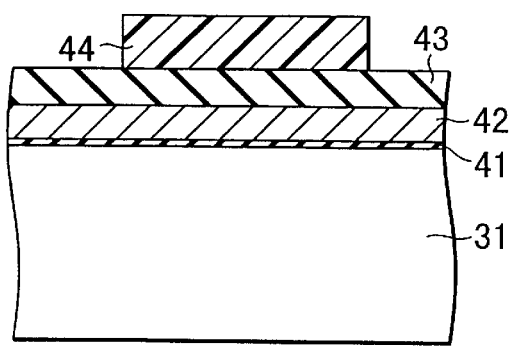
FIG. 12B is a cross sectional view taken along the 11C—11C line of the pattern shown in FIG. 11A and showing the first manufacturing step, for illustrating the manufacturing method of the semiconductor device according to the first embodiment of this invention.

Next, a manufacturing method of the n-channel MOSFET shown in FIGS. 11A, 11B and 11C is explained. FIGS. 12A and 12B to FIGS. 20A and 20B illustrate the manufacturing method of the semiconductor device according to the first embodiment of this invention, FIGS. 12A to 20A show the cross sections taken along the 11B—11B line of FIG. 11A in the order of the manufacturing steps and FIGS. 12B to 20B show the cross sections taken along the 11C—11C line of FIG. 11A in the order of the manufacturing steps. First, like the conventional case, a trench used for forming the STI structure is formed in the Si substrate by performing the manufacturing steps shown in FIGS. 12A and 12B to FIGS. 14A and 14B. That is, as shown in FIGS. 12A and 12B, the main surface of the p-type substrate 31 is subjected to the thermal oxidation process to form an $SiO_2$ film 41 with a thickness of 10 nm, for example, which is used as a buffer film. Then, a polycrystalline Si film 42 with a thickness of approx. 200 nm is deposited and formed on the $SiO_2$ film 41 by the LP-CVD method. Further, an $SiO_2$ film 43 with a thickness of approx. 200 nm is deposited and formed on the above film 42 by the LP-CVD method. Next, a mask (resist pattern) 44 corresponding to the element region is formed on the $SiO_2$ film 43 by the photo-etching process.

Figure 13A:
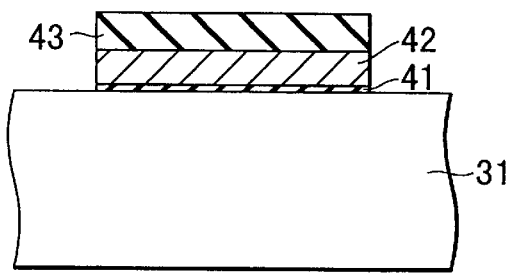
FIG. 13A is a cross sectional view taken along the 11B—11B line of the pattern shown in FIG. 11A and showing the second manufacturing step, for illustrating the manufacturing method of the semiconductor device according to the first embodiment of this invention.
Figure 13B:
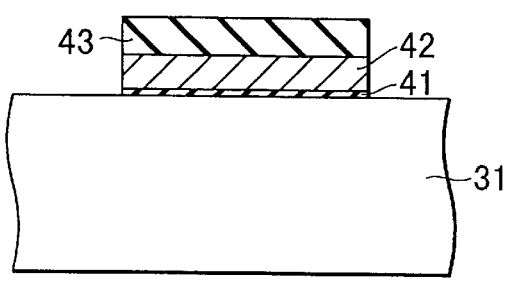
FIG. 13B is a cross sectional view taken along the 11C—11C line of the pattern shown in FIG. 11A and showing the second manufacturing step, for illustrating the manufacturing method of the semiconductor device according to the first embodiment of this invention.
Figure 14A:
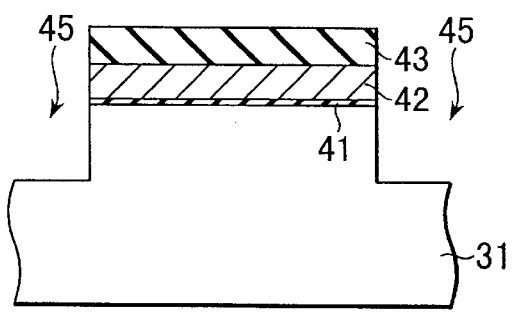
FIG. 14A is a cross sectional view taken along the 11B—11B line of the pattern shown in FIG. 11A and X showing the third manufacturing step, for illustrating the manufacturing method of the semiconductor device according to the first embodiment of this invention.
Figure 14B:
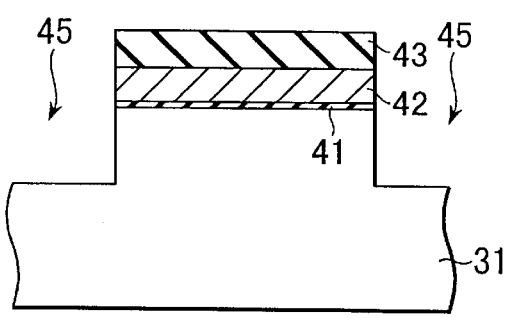
FIG. 14B is a cross sectional view taken along the 11C—11C line of the pattern shown in FIG. 11A and showing the third manufacturing step, for illustrating the manufacturing method of the semiconductor device according to the first embodiment of this invention.

The $SiO_2$ film 43 is etched with the resist pattern 44 used as a mask by the anisotropic dry etching process having a large selective etching ratio with respect to polycrystalline Si and then the resist pattern 44 is separated. After this, the polycrystalline Si film 42 is etched with the patterned $SiO_2$ film 43 used as a mask by the anisotropic dry etching process having a sufficiently large selective etching ratio with respect to an oxide film, further the thermal oxide film ($SiO_2$ film) 41 is etched, and as a result, the structure shown in FIGS. 13A and 13B is obtained. After this, the Si substrate 31 is etched to the depth of approx. 0.5 $\mu$m by the anisotropic dry etching process having a sufficiently large selective etching ratio with respect to an oxide film so as to form a trench 45 for forming the STI structure as shown in FIGS. 14A and 14B.

Figure 15A:
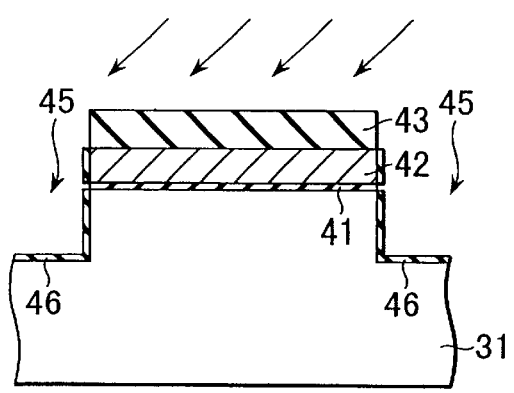
FIG. 15A is a cross sectional view taken along the 11B—11B line of the pattern shown in FIG. 11A and showing the fourth manufacturing step, for illustrating the manufacturing method of the semiconductor device according to the first embodiment of this invention.
Figure 15B:
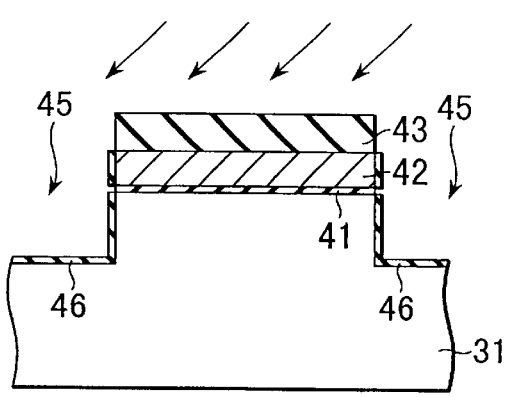
FIG. 15B is a cross sectional view taken along the 11C—11C line of the pattern shown in FIG. 11A and showing the fourth manufacturing step, for illustrating the manufacturing method of the semiconductor device according to the first embodiment of this invention.

Then, as shown in FIGS. 15A and 15B, a thermal oxide film 46 is formed to a thickness of 5 nm, for example, on the surface of the Si substrate 31 exposed to the trench 45 and nitrogen (N) is ion-implanted into the STI side surface portion to form a silicon nitride region 40. At this time, nitrogen ion is implanted at a preset angle, for example, 45°, with respect to the main surface of the Si substrate 31 while the Si substrate 31 is rotated. The condition of ion-implanting nitrogen is that the acceleration energy is 10 to 60 keV and the dose amount is $5 \times 10^{13}$ to $5 \times 10^{14}$ $cm^{-2}$. Under this condition, the peak concentration of nitrogen doped into the surface portion of the Si substrate 31 is 0.5 atom % or more.

Figure 16A:
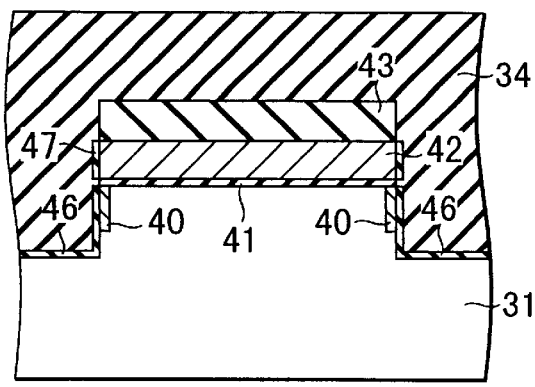
FIG. 16A is a cross sectional view taken along the 11B—11B line of the pattern shown in FIG. 11A and showing the fifth manufacturing step, for illustrating the manufacturing method of the semiconductor device according to the first embodiment of this invention.
Figure 16B:
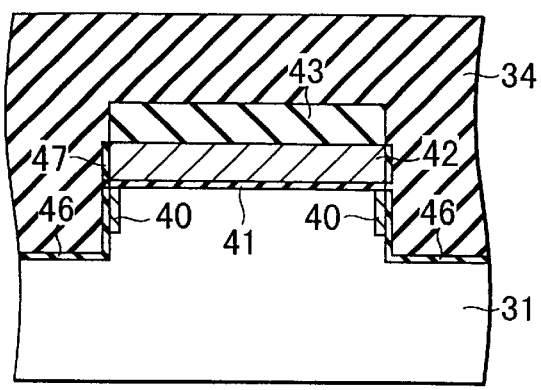
FIG. 16B is a cross sectional view taken along the 11C—11C line of the pattern shown in FIG. 11A and showing the fifth manufacturing step, for illustrating the manufacturing method of the semiconductor device according to the first embodiment of this invention.

Immediately after this, the semiconductor structure is subjected to the heat treatment in the $N_2$ atmosphere or oxidation atmosphere, defects caused in the main surface of the Si substrate at the etching time of the trench 45 are restored, and then, an $SiO_2$ film 34 is deposited and formed to a thickness of approx. 1.5 $\mu$m on the entire surface of the resultant semiconductor structure by the LP-CVD method as shown in FIGS. 16A and 16B.

Next, the $SiO_2$ films 34, 43 are polished and made flat by the CMP method until the polycrystalline Si film 42 is exposed.

Figure 17A:
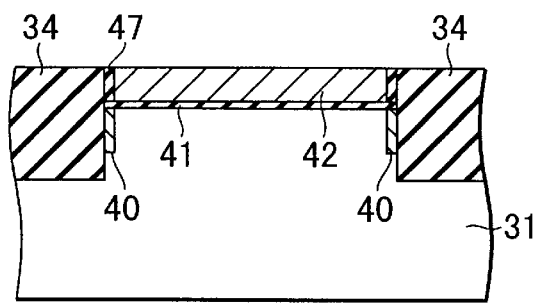
FIG. 17A is a cross sectional view taken along the 11B—11B line of the pattern shown in FIG. 11A and showing the sixth manufacturing step, for illustrating the manufacturing method of the semiconductor device according to the first embodiment of this invention.
Figure 17B:
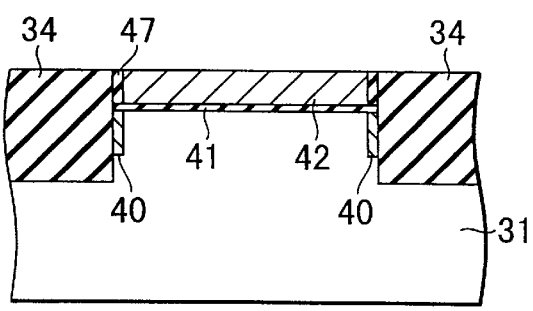
FIG. 17B is a cross sectional view taken along the 11C—11C line of the pattern shown in FIG. 11A and showing the sixth manufacturing step, for illustrating the manufacturing method of the semiconductor device according to the first embodiment of this invention.
Figure 18A:
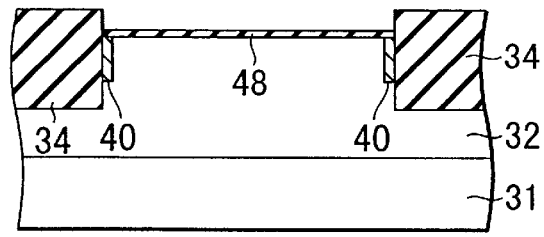
FIG. 18A is a cross sectional view taken along the 11B—11B line of the pattern shown in FIG. 11A and showing the seventh manufacturing step, for illustrating the manufacturing method of the semiconductor device according to the first embodiment of this invention.
Figure 18B:
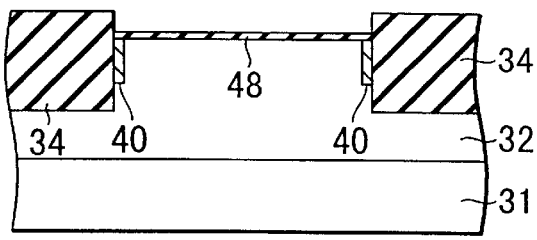
FIG. 18B is a cross sectional view taken along the 11C—11C line of the pattern shown in FIG. 11A and showing the seventh manufacturing step, for illustrating the manufacturing method of the semiconductor device according to the first embodiment of this invention.

The process effected after this is the same as the conventional manufacturing process shown in FIGS. 5A and 5B to FIGS. 7A and 7B. First, the surfaces of the $SiO_2$ films 34, 43 are subjected to the etching process using $NH_4F$ or the dry etching process to completely expose the polycrystalline Si film 42 (FIGS. 17A and 17B). Then, the polycrystalline Si film 42 and an SiN film 47 formed on the side wall portion thereof are etched and removed by the isotropic dry etching process having a sufficiently large selective etching ratio with respect to $SiO_2$. After this, the heat treatment for reducing the film stress of the remaining $SiO_2$ film (buried oxide film) 34 is effected at a temperature of 1000° C., for example. Then, the $SiO_2$ film 41 on the Si substrate 31 is removed by the etching process using $NH_4F$ and a new $SiO_2$ film (sacrificial oxide film) 48 is formed on the Si substrate 31 by thermally oxidize the surface of the Si substrate 31 at a temperature of 800° C., for example. Next, boron (B) is implanted into the Si substrate 31 via the $SiO_2$ film 48 in a condition that, for example, the acceleration energy is 200 kev and the dose amount is approx. $8 \times 10^{12}$ $cm^{-2}$ so as to form a p-well region 32. Further, boron (B) is implanted in a condition that, for example, the acceleration energy is 50 keV and the dose amount is approx. $1 \times 10^{13}$ $cm^{-2}$ in order to adjust the threshold voltage of the n-channel MOSFET. Next, the heat treatment is effected at a temperature of 1000° C. for approx. 30 seconds to activate the doped impurity (FIGS. 18A and 18B).

Figure 19A:
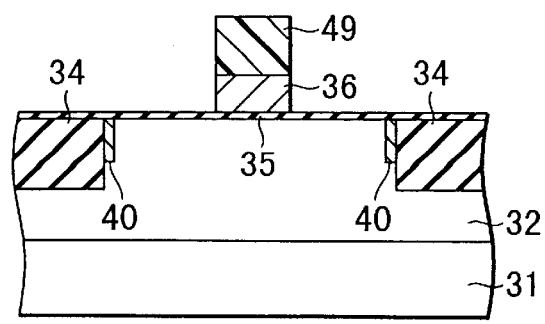
FIG. 19A is a cross sectional view taken along the 11B—11B line of the pattern shown in FIG. 11A and showing the eighth manufacturing step, for illustrating the manufacturing method of the semiconductor device according to the first embodiment of this invention.
Figure 19B:
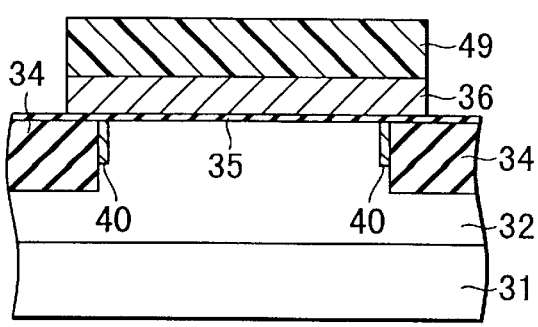
FIG. 19B is a cross sectional view taken along the 11C—11C line of the pattern shown in FIG. 11A and showing the eighth manufacturing step, for illustrating the manufacturing method of the semiconductor device according to the first embodiment of this invention.

Further, the thermal oxide film ($SiO_2$ film) 48 on the surface of the Si substrate 31 is removed and a gate oxide film 35 with a thickness of approx. 6 nm is formed at a temperature of 750° C. Then, polycrystalline Si is deposited to a thickness of approx. 300 nm on the gate oxide film 35 by the LP-CVD method. Next, a mask (resist pattern) 49 for forming a gate electrode is formed on the polycrystalline Si film by the photo-etching process and the anisotropic dry etching process having a sufficiently large selective etching ratio with respect to $SiO_2$ is effected with the resist pattern 49 used as a mask to form a gate electrode 36 (FIGS. 19A and 19B).

Figure 20A:
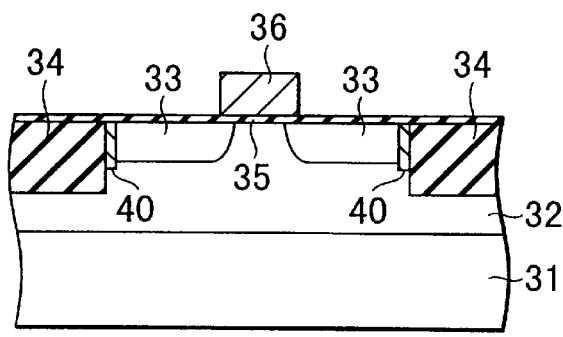
FIG. 20A is a cross sectional view taken along the 11B—11B line of the pattern shown in FIG. 11A and showing the ninth manufacturing step, for illustrating the manufacturing method of the semiconductor device according to the first embodiment of this invention.
Figure 20B:
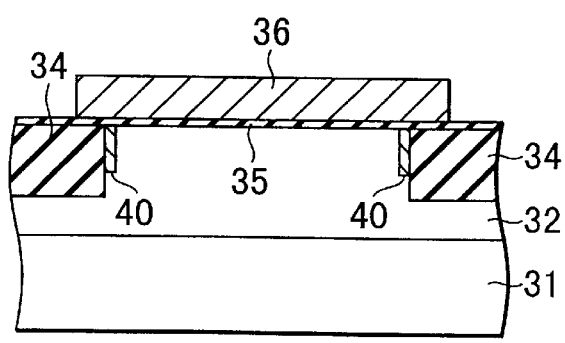
FIG. 20B is a cross sectional view taken along the 11C—11C line of the pattern shown in FIG. 11A and showing the ninth manufacturing step, for illustrating the manufacturing method of the semiconductor device according to the first embodiment of this invention.

After this, as shown in FIGS. 20A and 20B, arsenic (As) is ion-implanted into the Si substrate 31 in a condition that the acceleration energy is 50 keV and the dose amount is approx. $5 \times 10^{15}$ $cm^{-2}$. Then, the heat treatment is effected for approx. 30 seconds in an $N_2$ atmosphere of 1000° C. to form $n^+$-type diffusion layers used as the source/drain regions 33. At this time, since the ion-implantation process is effected with the gate electrode 36 used as a mask, the gate electrode 36 is also doped with impurity and becomes an $n^+$ type.

After this, a preset metallization process is effected to form the n-channel MOSFET. That is, after an inter-level insulating film ($SiO_2$/BPSG) 37 is formed on the resultant semiconductor structure, contact holes are formed on the $n^+$-type diffusion layers used as the source/drain regions 33. Then, for example, tungsten (W) is filled in the contact holes by the LP-CVD method to form contact plugs 38. AlCu or the like is deposited on the inter-level insulating film 37 and patterned to form metal wirings as source/drain electrodes 39. Thus, the n-channel MOSFET of the structure shown in FIGS. 11A, 11B and 11C can be formed.

According to the above manufacturing method, since the silicon nitride region 40 having the barrier property against out diffusion of boron (B) which is substrate impurity is formed in the Si substrate 31 near the STI region adjacent to the channel region of the n-channel MOSFET, the out diffusion of boron (B) can be suppressed by the presence of the region 40 and the kink characteristic can be improved. The depth of the silicon nitride region 40 formed at this time can be freely adjusted by changing the implantation angle with respect to the wafer (Si substrate 31) at the time of ion-implantation of nitrogen (N) and rotating the wafer. The nitrogen doping depth may be different depending on the temperature and the like in the heat treatment effected to form the MOSFET after the ion-implantation process for controlling the threshold voltage of the MOSFET and p-well region 32 is effected and it is preferable to set the depth deeper than at least the depth which determines the threshold voltage of the MOSFET or the depth to which the depletion layer extends to the largest extent at the interface between the source/drain region 33 and the substrate (p-well region 32) of the MOSFET. For example, in the MOSFET formed based on the 0.25 $\mu$m design rule, the depth is approx. 40 nm or more from the main surface of the Si substrate 31.

In the above manufacturing method, the silicon nitride region 40 is formed on the side wall portion of the STI structure, but the silicon nitride region 40 can be formed in a portion of the Si substrate 31 (p-well region 32) which ranges from the side wall portion of the STI structure to the bottom portion thereof by changing the angle of the ion-implantation according to the required characteristic, for example, changing the angle with respect to the main surface of the Si substrate 31 from 45° to 90°. With this structure, a lowering in the driving power of the MOSFET can be suppressed to minimum.

Further, in the step shown in FIGS. 15A and 15B, the thermal oxide film 46 formed on the surface of the Si substrate 31 in the trench 45 is not necessarily formed, but if it is formed, the preferable film thickness thereof is 50 nm or less.

[Second Embodiment]

FIGS. 21A and 21B to FIGS. 23A and 23B illustrate a semiconductor device and a manufacturing method thereof according to a second embodiment of this invention and show a different manufacturing process of an n-channel MOSFET. FIGS. 21A to 23A show cross sections taken along the 11B—11B line of FIG. 11A in the respective manufacturing steps, and FIGS. 21B to 23B show cross sections taken along the 11C—11C line of FIG. 11A in the respective manufacturing steps.

Figure 21A:
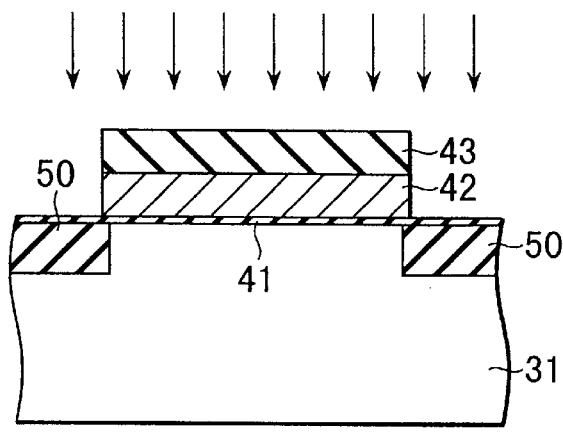
FIG. 21A is a cross sectional view taken along the 11B—11B line of the pattern shown in FIG. 11A and showing part of the manufacturing steps, for illustrating a semiconductor device and a manufacturing method thereof according to a second embodiment of this invention.
Figure 21B:
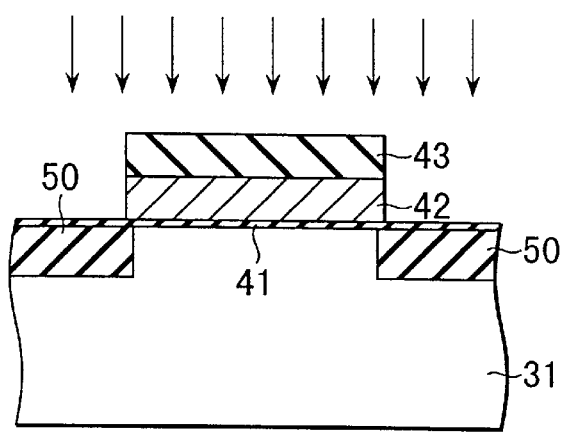
FIG. 21B is a cross sectional view taken along the 11C—11C line of the pattern shown in FIG. 11A and showing part of the manufacturing steps, for illustrating the semiconductor device and the manufacturing method thereof according to the second embodiment of this invention.

In the second embodiment, by the same process as that shown in FIGS. 12A and 12B and FIGS. 13A and 13B, a polycrystalline Si film 42 is etched and patterned and then nitrogen (N) is ion-implanted into an Si substrate 31 via a thermal oxide film 41 with, for example, the acceleration voltage 100 keV (FIGS. 21A and 21B). As a result, a silicon nitride region 50 acting as a barrier material to out diffusion of boron (B) is formed in a region in which a buried oxide film used as an element isolation region is to be formed and a portion of the Si substrate 31 which lies near the film forming region. The silicon nitride region 50 is not formed in the effective channel region of a MOSFET which will be formed later and is formed from the surface of the Si substrate 31 to a region deeper than the substrate depth which determines the threshold voltage of the MOSFET.

Figure 22A:
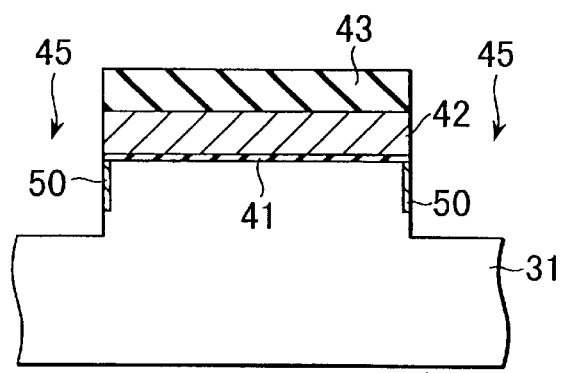
FIG. 22A is a cross sectional view taken along the 11B—11B line of the pattern shown in FIG. 11A and showing the manufacturing step following the manufacturing step shown in FIGS. 21A and 21B, for illustrating the semiconductor device and the manufacturing method thereof according to the second embodiment of this invention.
Figure 22B:
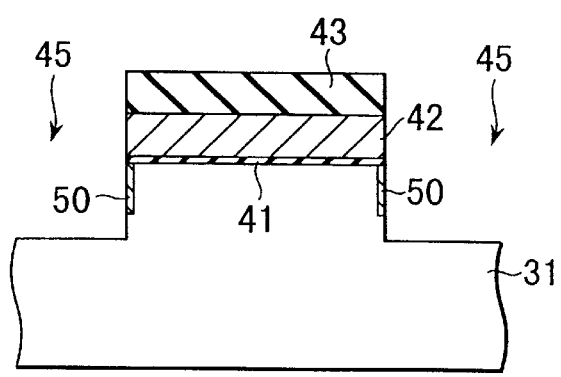
FIG. 22B is a cross sectional view taken along the 11C—11C line of the pattern shown in FIG. 11A and showing the manufacturing step following the manufacturing step shown in FIGS. 21A and 21B, for illustrating the semiconductor device and the manufacturing method thereof according to the second embodiment of this invention.

Next, after the thermal oxide film 41 is removed to expose the main surface of the Si substrate 31, the main surface of the Si substrate 31 is etched to form a trench 45 for STI. At the time of formation of the trench 45, the Si substrate 31 is etched to the depth of approx. 0.5 $\mu$m by the anisotropic dry etching process having a large selective etching ratio with respect to an oxide film. As a result, as shown in FIGS. 22A and 22B, the silicon nitride region 50 is left behind in the Si substrate 31 on the side wall portion of the trench 45.

Figure 23A:
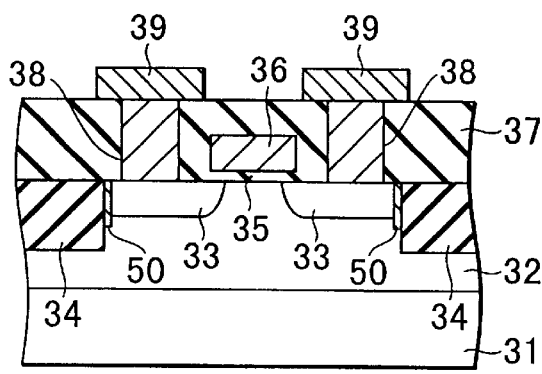
FIG. 23A is a cross sectional view taken along the 11B—11B line of the pattern shown in FIG. 11A and showing the construction of an n-channel MOSFET formed, for illustrating the semiconductor device and the manufacturing method thereof according to the second embodiment of this invention.
Figure 23B:
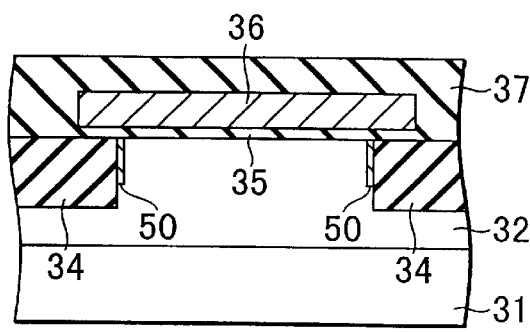
FIG. 23B is a cross sectional view taken along the 11C—11C line of the pattern shown in FIG. 11A and showing the construction of the n-channel MOSFET formed, for illustrating the semiconductor device and the manufacturing method thereof according to the second embodiment of this invention.

After this, like the conventional manufacturing method, the processes of formation of an element isolation region of STI structure, formation of a MOSFET, and metallization are effected and the MOSFET shown in FIGS. 23A and 23B is manufactured.

According to the above structure and manufacturing method, the silicon nitride region 50 having the barrier property to out diffusion of boron (B) can be easily formed in the Si substrate 31 near the STI region adjacent to the channel region of the n-channel MOSFET, and as a result, the same operation and effect as those of the first embodiment can be attained. The width and depth of the silicon nitride region 50 can be freely and precisely adjusted by changing the acceleration energy at the time of ion-implantation of nitrogen (N).

[Third Embodiment]

Figure 24A:
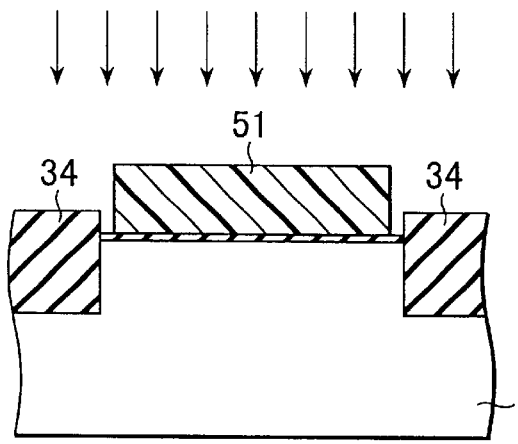
FIG. 24A is a cross sectional view taken along the 11B—11B line of the pattern shown in FIG. 11A and showing part of the manufacturing steps, for illustrating a semiconductor device and a manufacturing method thereof according to a third embodiment of this invention.
Figure 24B:
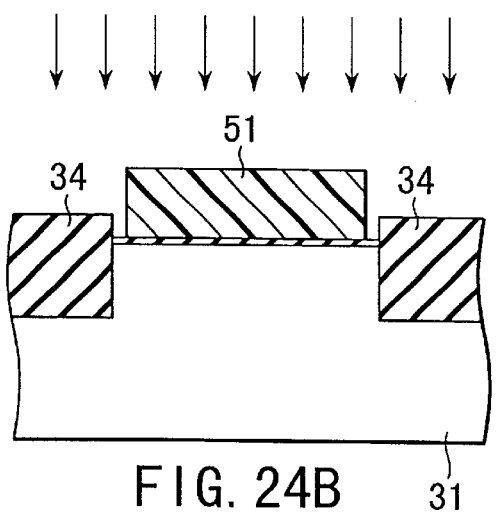
FIG. 24B is a cross sectional view taken along the 11C—11C line of the pattern shown in FIG. 11A and showing part of the manufacturing steps, for illustrating the semiconductor device and the manufacturing method thereof according to the third embodiment of this invention.
Figure 25A:
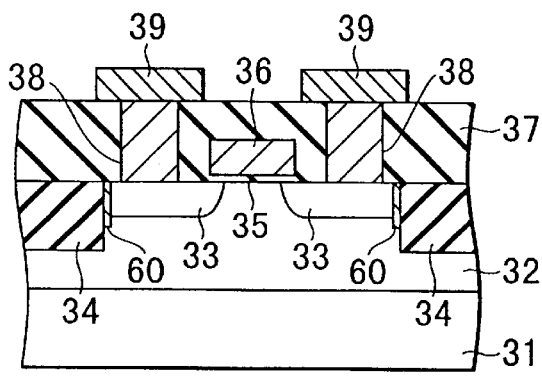
FIG. 25A is a cross sectional view taken along the 11B—11B line of the pattern shown in FIG. 11A and showing the construction of an n-channel MOSFET formed, for illustrating the semiconductor device and the manufacturing method thereof according to the third embodiment of this invention.
Figure 25B:
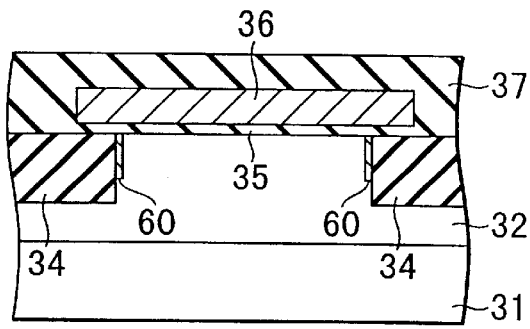
FIG. 25B is a cross sectional view taken along the 11C—11C line of the pattern shown in FIG. 11A and showing the construction of the n-channel MOSFET formed, for illustrating the semiconductor device and the manufacturing method thereof according to the third embodiment of this invention.

FIGS. 24A and 24B and FIGS. 25A and 25B illustrate a semiconductor device and a manufacturing method thereof according to a third embodiment of this invention and show the manufacturing steps of an n-channel MOSFET. FIGS. 24A and 25A show cross sections taken along the 11B—11B line of FIG. 11A in the respective manufacturing steps, and FIGS. 24B and 25B show cross sections taken along the 11C—11C line of FIG. 11A in the respective manufacturing steps.

In the third embodiment, like the conventional manufacturing method, after the manufacturing steps shown in FIGS. 2A and 2B to FIGS. 6A and 6B are effected, and after a buried oxide film 34 for STI is made flat and before impurity for forming a p-well region or the like is ion-implanted, a mask (resist pattern) 51 is formed by the photo-etching process. The resist pattern 51 has an offset of 0.2 $\mu$m, for example, from the STI end portion to cover the element region. Then, nitrogen (N) is ion-implanted into the Si substrate 31 with the resist pattern 51 used as a mask (FIGS. 24A and 24B).

After this, like the conventional manufacturing method, a p-well region 32 is formed, ion-implantation of impurity for controlling the threshold voltage is effected, and finally, an n-channel MOSFET as shown in FIGS. 25A and 25B is formed. A silicon nitride region 60 is formed in the Si substrate 31 (p-well region 32) adjacent to the STI region by nitrogen (N) doped in the step shown in FIGS. 24A and 24B. Therefore, like the first and second embodiments described before, out diffusion of boron (B) can be suppressed by the presence of the silicon nitride region 60 and the kink characteristic can be improved.

In the first to third embodiments, a case wherein the n-channel MOSFET using boron (B) as substrate impurity is used as an example is explained, but this invention can be applied to another case wherein impurity ion which is out diffusion in the MOSFET is doped into the channel region thereof, and in this case, a material layer having a barrier property to doped impurity ion may be formed on the STI interface.

Further, the MOSFET is explained as an example, but this invention can also be applied to a MISFET in the same manner.

As described above, according to this invention, a semiconductor device and a manufacturing method thereof can be provided in which a leak current caused by the kink characteristic can be reduced and the high integration density and high performance can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, comprising the steps of:

forming a buffer film on a semiconductor substrate;

forming a mask used for forming a trench for STI (Shallow Trench Isolation) in the main surface portion of the semiconductor substrate on the buffer film;

ion-implanting nitrogen (N) into the semiconductor substrate by use of the mask to form a silicon nitride (SiN) region;

etching the main surface of the semiconductor substrate by use of the mask to form a trench, a barrier region formed of part of the silicon nitride region which is left behind being formed on the side wall portion of the trench;

filling an insulating material into the trench to form an element isolation region of STI structure; and forming a MISFET in an element region isolated by the element isolation region.

2. The manufacturing method of the semiconductor device according to claim 1, wherein impurity contained in a channel region of the MISFET is boron (B).

3. The manufacturing method of the semiconductor device according to claim 1, wherein the semiconductor substrate is an Si substrate.

4. A method for manufacturing a semiconductor device, comprising the steps of:

forming a trench for STI (Shallow Trench Isolation) in the main surface portion of a semiconductor substrate;

filling an insulating material into the trench to form an element isolation region of STI structure;

forming a mask on part of an element region except a boundary region with the element isolation region;

ion-implanting nitrogen (N) into the boundary region of the semiconductor substrate with the element isolation region by use of the mask to form a barrier region containing silicon nitride (SiN); and forming a MISFET in the element region isolated by the element isolation region.

5. The manufacturing method of the semiconductor device according to claim 4, wherein impurity contained in a channel region of the MISFET is boron (B).

6. The manufacturing method of the semiconductor device according to claim 4, wherein the semiconductor substrate is an Si substrate.

* * * * *